United States Patent [19]

Kellerhals

[11] Patent Number: 4,746,802
[45] Date of Patent: May 24, 1988

[54] ION CYCLOTRON RESONANCE SPECTROMETER

[75] Inventor: Hanspeter Kellerhals, Uster, Switzerland

[73] Assignee: Spectrospin AG, Zurich, Switzerland

[21] Appl. No.: 924,854

[22] Filed: Oct. 28, 1986

[30] Foreign Application Priority Data

Oct. 29, 1985 [DE] Fed. Rep. of Germany ....... 3538407

[51] Int. Cl.$^4$ ............................................. B01D 59/44
[52] U.S. Cl. ..................................... 250/291; 250/281; 250/288
[58] Field of Search ............... 250/281, 282, 290, 291, 250/292, 293, 294; 436/173

[56] References Cited

U.S. PATENT DOCUMENTS

| | | |
|---|---|---|
| 3,511,986 | 5/1970 | Llewellyn . |
| 3,937,955 | 2/1976 | Comisarow et al. ................ 250/285 |
| 4,315,149 | 2/1982 | Ledford, Jr. ......................... 250/282 |
| 4,535,235 | 8/1985 | McIver, Jr. .......................... 250/291 |
| 4,686,365 | 10/1987 | Meek et al. ......................... 250/290 |

FOREIGN PATENT DOCUMENTS 331136 3/1985 Fed. Rep. of Germany .
3515766 11/1986 Fed. Rep. of Germany .

OTHER PUBLICATIONS

Lawson et al., Weak Peak Enhancement by Selective Ion Trapping in a Quadrupole Ion Storage Source, 9/77, 1619-1622.
R. L. Settine et al., "ESN European Spectroscopy News", 58, 1985, pp. 16 to 18.
R. T. McIver et al., "Proc. 31. Annu. Conf. Mass Spectrom. Allied Top, 1983, Boston".
European Search Report For Serial No. EP 86113410.4, dated 11/02/87.

*Primary Examiner*—Carolyn E. Fields
*Assistant Examiner*—John A. Miller
*Attorney, Agent, or Firm*—Pretty, Schroeder, Brueggemann & Clark

[57] ABSTRACT

An Ion cyclotron resonance spectrometer comprises a first cell (8) which can be evacuated to a normal high vacuum and which is coupled with means (17, 18) for ionizing a sample substance. The first cell (8) is connected with a second cell (11) via a partition wall (15) provided with a small opening (14), which second cell (11) comprises an ion trap (27, 31) located in the homogenous area of the magnet arrangement (1, 2) and adapted for determining ion cyclotron resonances. The second cell (11) can be evacuated to a superhigh vacuum. The first cell (8) comprises an area located outside the magnet arrangement (1, 2) which lies still within the stray field of the magnet arrangement and which may be provided with an additional magnet (35) so that any desired substance can be ionized therein by any suitably adapted equipment. The ions thus produced can be displaced by means of potential grids (22, 23, 24) located within the first chamber (8), which may be caused to form ion traps by applying suitable potentials, towards the end of the first cell (8) located inside the magnet arrangement (1, 2) and transferred substantially completely to the ion trap (27, 31) arranged in the second cell (11).

7 Claims, 1 Drawing Sheet

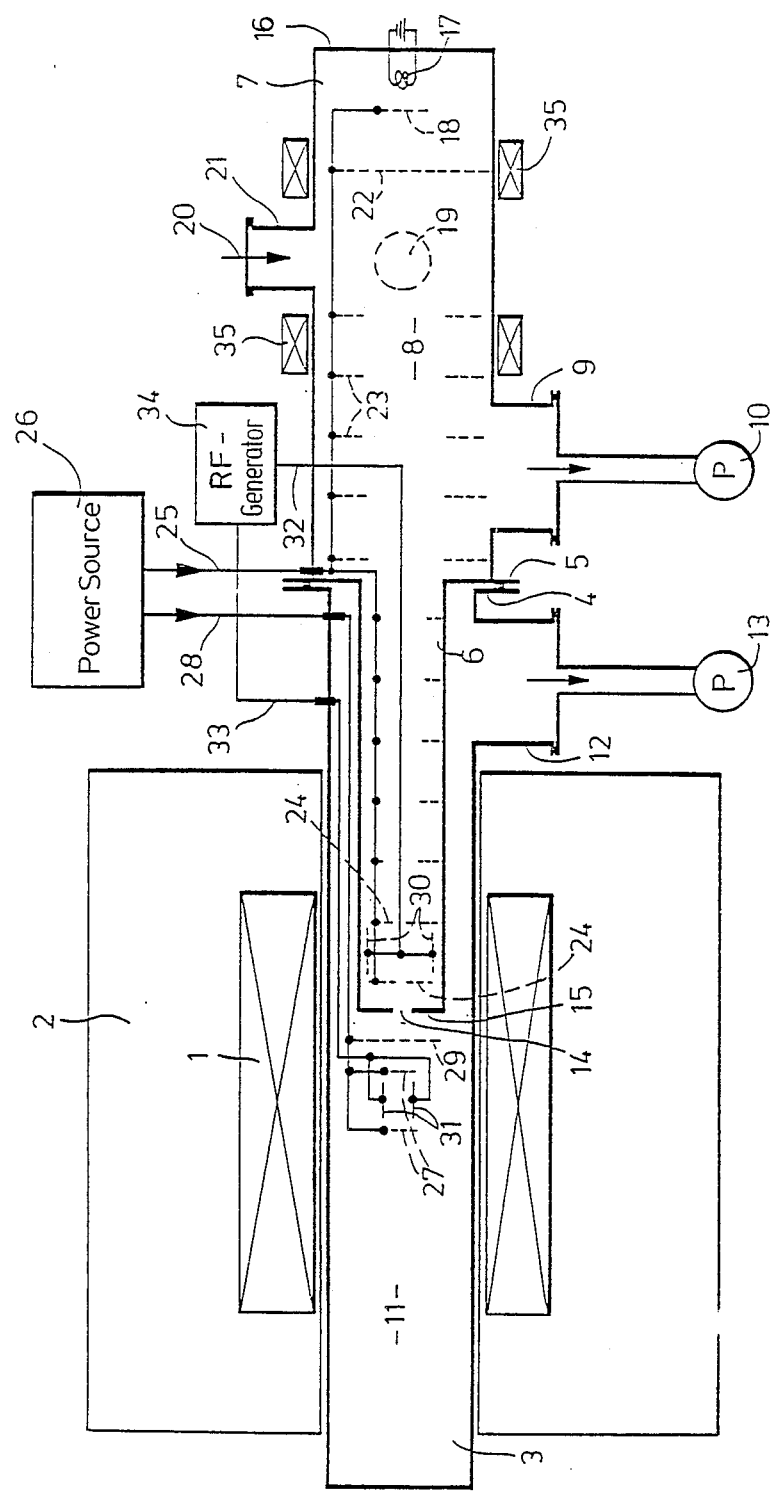

ION CYCLOTRON RESONANCE SPECTROMETER

The present invention relates to an ion cyclotron resonance spectrometer comprising a magnet arrangement generating a constant magnetic field which is homogenous in a predetermined area, and two cells arranged in the said magnetic field and provided with electrodes forming an ion trap when corresponding potentials are applied, the said cells being separated from each other through a common partition wall extending perpendicularly to the direction of the magnetic field and provided with a small opening, and interconnected on the other hand by pumping means which permit different vacuum conditions to be produced in the two cells, and comprising further ionization means connected to the first cell that can be evacuated to a low vacuum, and transmitter/receiver means connected to the second cell that can be evacuated to a higher vacuum, and a power pack for supplying the electrodes with potentials permitting the electrodes, selectively, to be retained in the respective ion trap or to be released for distribution between the two cells.

An ion cyclotron resonance spectrometer of this type has been described already in a paper by R. L. Settine et al published in "ESN European Spectroscopy News", 58, (1985), pages 16 to 18. In the case of this known spectrometer, the two cells are arranged immediately following each other in the homogenous area of the magnetic field and are provided not only with a partition wall, but also with small holes or windows provided in the electrodes extending parallel thereto, which holes or windows permit an electron beam to be directed through the two cells. During this process, the number of ions produced in the first cell in which the lower vacuum prevails is much higher than that produced in the second cell in which the higher vacuum prevails and where, accordingly, the gas density is much lower. For example, the gas pressure may be approximately $10^{-5}$ hPa in the first cell and approximately $10^{-8}$ to $10^{-9}$ hPa in the second cell. Accordingly, ionization of the gas will be 100 to 1000 times higher in the first cell than in the second cell. Since both cells are located in the homogenous area of the magnetic field, the ions so produced, while moving perpendicularly to the magnetic field along circular cyclotron paths due to their thermal energy, are free to move in the direction of the magnetic field and, accordingly, to pass from the cell in which the higher pressure prevails into the cell in which the lower pressure prevails. In this manner, the ions are distributed evenly over the two cells so that the number of ions available in the second cell is much higher than the number that could be produced in this cell by mere excitation of the gas.

The disadvantage of this known arrangement lies in the fact that the two cells are located in the homogenous part of the magnetic field which does not lend itself easily for application of different ionization methods, due to the limited space available and the influence of the magnetic field. When adapting the ionization means to the limited space available in the magnetic field, one also has to take care not to impair the properties of the cell used for analysis purposes.

From German Patent Application No. P 35 15 766.6, which forms part of the prior art, it has been known, for example, to produce ions outside the magnetic field and to transfer them thereafter in the form of an ion beam into the analyzer cell located in the magnetic field. The ions can, thus, be produced by means of all the known methods under a normal high vacuum in the range of $10^{-5}$ hPa, while the measuring cell can again be maintained at a lower pressure of approximately $10^{-8}$ by differential pumping. However, this known method is still problematic insofar as the efficiency of the ion transfer is relatively low. In addition, the apparatus input required for the ion transfer is relatively complex and must be adjusted with extreme accuracy to ensure the introduction of the ions into the measuring cell. Another disadvantage of this arrangement lies in the fact that there is no possibility of storing the ions produced during the measuring process as such.

The transfer of externally produced ions into the measuring cells using quadrupole elements, as described by R. T. McIver et al in "Proc. 31.Annu. Conf. Mass Spectrom. Allied Top, 1983, Boston" is even more complicated. In addition, the transfer efficiency that can be expected is only low.

Now, it is the object of the present invention to improve an ion cyclotron resonance spectrometer of the type described above in such a manner that the ions can be produced with simple devices and by any desired method.

This object is achieved according to the invention by an arrangement in which the first cell comprises a section located outside the magnet arrangement in the area of its stray field and the ionization means is connected to this section of the said first cell.

Accordingly, in the case of the spectrometer according to the invention, the cell in which the higher vacuum prevails and to which the ionization means is connected is of such a size that it extends into an area outside the magnet arrangement where it is accessible for any desired ionization equipment. The latter may, therefore, be set up without notable restrictions as to the space requirements and without regard to the homogenous magnetic field required for measuring as the latter is no longer influenced notably by the parts located outside the magnet arrangement.

The spectrometer according to the invention thus permits extremely efficient ionization of the gas contained in the first cell. The configuration of the cells then makes it possible, just as in the case of the known spectrometer, to operate both cells as one unit so that the ions distribute themselves uniformly over both cells. While due to the proportion in size of the two cells only a small portion of the ions produced will enter the smaller measuring cell, it is also possible to produce a higher number of ions during the ionization phase, due to the higher proportion of gas under higher pressure, so that insofar no substantial loss is encountered as compared with the ion density that can be achieved in the measuring chamber of the known spectrometer.

During the ionization phase, the entire cell arrangement is operated as an ion trap. Accordingly, the portion of the first cell located outside the magnet arrangement must also be exposed to a certain magnetic field which, together with the potentials applied to the cell, must ensure that the ions remain trapped in the cells. In case the stray field shold be insufficient for this purpose, the portion of the first cell located outside the magnet arrangement may be arranged within the reach of the field of an additional magnet. Such an additional magnet, which does not have to produce a field of high strength or particularly good homogeneity, can be produced at low cost and arranged in a manner which does not intefere with the ionization process.

According to a further embodiment of the invention, a number of grids may be arranged in the first cell in parallel to the partition wall and connected in an electrically conductive manner with the power pack which contains means for controlling the potentials applied to the grids in such a manner that the ion trap is formed by sections of the first cell defined by the said grids and can be displaced along the first cell from the area located outside the magnet arrangement towards the partition wall and, if necessary, even beyond the latter. In this manner, it is possible to displace the ions produced along the first cell and to transfer them almost completely to the second cell so that an extraordinarily high transfer efficiency is ensured. It is, therefore, possible with this variant of the spectrometer according to the invention, under ultra-high vacuum conditions, to achieve an ion density which heretofore has been deemed impossible. This permits the sensitivity and resolving power of such a spectrometer to be improved quite considerably.

According to another embodiment of the invention, a number of grids arranged parallel to the partition wall and connected with the power pack in an electrically conductive manner may be provided also in the second cell to limit the ion trap to a section of the second cell adjacent to the partition wall. The cell would in this case represent substantially a vacuum vessel accommodating the ion trap forming the measuring chamber which is optimally designed with respect to the ion cyclotron resonance measurements. This arrangement then provides the possibility to arrange a shield grid between the partition wall and the grid delimiting the ion trap of the second cell and provided adjacent the partition wall. With the aid of such a shield grid it is possible, by application of a sufficiently high potential, to separate the two cells electrically so that the gas contained in the first cell can be ionized therein without any difficulty, while the ion cyclotron resonance measurement is being carried out in the second cell. The design of the shield grid and the potential applied may also be selected to ensure that the electron or ion beams used for ionization are prevented from entering the measuring chamber.

According to a preferred embodiment of the invention, electrodes arranged parallel to the magnetic field for generating alternating fields suited for producing ion cyclotron resonances may be arranged in the first and/or second cell at least between two neighboring grids. In this manner, it is possible to obtain in the first cell, too, a zone which lies in the homogenous area of the magnetic field generated by the magnet arrangement and in which, therefore, ion cyclotron resonances can be generated for pre-determined mass/charge ratios. This arrangement allows the selection of certain ions which can then be transferred into the measuring cell in the manner described before.

The invention will now be described and explained with reference to a spectrometer which is represented in the drawing only diagrammatically. The features that can be derived from the specification and the drawing may be employed in other embodiments of the invention individually or in any desired combination.

The ion cyclotron resonance spectrometer shown in the drawing comprises a magnet arrangement consisting of a superconductive coil 1 and a Dewar 2 enclosing the latter. The cylindrical hollow space enclosed by the coil 1 and the Dewar 2 is passed by a tube 3 closed on its one end and carrying on its other end a flange 4 which is connected tightly with the flange 5 of another tube 6 projecting concentrically into the tube 3 to a point close to the longitudinal center of the coil 1. The flange 5 is followed on its outer end by another tube 7 of a diameter larger than the diameter of the other tubes 6 and 3. The tubes 6 and 7 form a first cell 8 provided with a lateral connection stem 9 which is disposed outside of the magnet arrangement in the area of the tube 7 and which forms the connection for a vacuum pump 10. The vacuum pump 10 is adapted to produce a normal high vacuum at a pressure of approximately $10^{-5}$ hPa. Similarly, the tube 3 with its flange 4 forms a second cell 11 provided with a connection stem 12 at a point outside the Dewar 2, for connection to the pump 13. The pump 13 is adapted for generating an ultrahigh vacuum at a pressure of approximately $10^{-8}$ hPa. The two cells 8 and 11 communicate via a small opening 14 arranged in the end wall 15 closing the tube 6 of the first cell 8.

At the end of the first cell 8 opposite the end wall 15, near the bottom 16 of the tube 7, there is provided a filament 17 which, when suitably heated, emits electrons. Using an accelerator grid 18, these electrons can be directed to a neighboring ionization region 19 where they hit upon the gas molecules contained in the first cell 8. The gas to be examined may be supplied to the first cell 8 via an inlet system indicated in the drawing only diagrammatically, by the arrow 20 and the stem 21.

The first cell contains a number of potential grids 22, 23, 24 which are arranged axially one behind the other and which are connected to a power source 26 via a cable 25 comprising a corresponding number of lines. The power source 26 permits different potentials to be applied to the potential grids.

Similarly, the second cell 11 also contains two potential grids 27 which are arranged at a relatively small distance from the end wall 15 of the first cell 8 and which are also connected to the power source 26 in an electrically conductive manner via a corresponding cable 28. Between the one of the potential grids 27 and the end face 15 of the said first cell 8, there is further provided a shield grid 29 which is likewise connected to the power source 26 via one line of the cable 28. In the region between the electrodes 24 neighboring the end wall 15 of the first cell 8 and the two elctrodes 27 in the second cell 11, there are provided electrodes 30 and 31 which extend in parallel to the tube axix and which are connected each with one output of an rf generator 34 via cables 32 and 33, respectively. The potential grids 27 form together with the associated electrodes 31 the ion cyclotron resonance measuring cell. The latter is arranged at the center of the magnet where the field of the magnet coil 1 is extremely homogenous. The section of the cell 8 which is defined by the electrodes 30 is still located within the coil 1 and, thus, in a region of the magnetic field exhibiting good homogeneity, which permits any undesired ions to be selectively eliminated by irradiation of suitable cyclotron frequencies through these electrodes. Since a great portion of this first cell 8 is located only in the stray field of the magnet arrangement, two additional magnet coils 35 surrounding the tube 7 are arranged on either side of the ionization region 19 provided in the first cell 8. The magnetic field generated by these two magnetic coils 35 is only of moderate strength and also of moderate homogeneity in the ionization region, which is however sufficient to force the generated ions to move along cyclotron paths and to retain them in this manner in a pre-determined portion of the first cell 8.

In operation, a substance that has been introduced into the ionization region 19 using the means 20 is ionized by bombardment with the electrons that have been generated by the filament 17 and accelerated by the potential grid 18. This process takes place at the regular high vacuum in the range of approximately $10^{-5}$ hPa generated by the pump 10. By applying suitable potentials to the potential grids 22, 23, the generated ions can be retained in the ionization region in a manner similar to that of an ion trap. By varying the potentials applied to the potential grids 23 by corresponding, maybe programmed, adjustment of the power source 26 it is possible to displace the ion trap which is defined by any two potential grids 22, 23 and which may easily comprise a region extending over several successive potential grids towards the end of the first cell 8 located within the magnet coil 1. In this connection, it is also imaginable to provide that initially the entire first cell 8 forms an ion trap so that a substantial part of all of the gas contained in the first cell 8 is ionized due to the movement of the gas molecules and ions, and that thereafter the potentials are varied to displace the end of the ion trap initially formed by the potential grid 22 located adjacent the bottom 16 of the first chamber 8 progressively in the direction of that end of the cell which is located inside the magnet coil 1 until finally all ions are concentrated near this end. When all ions are between the potential grids 24 neighboring the end wall 15, then the ions can be selected with the aid of the electrodes 30, by applying a voltage supplied by the rf generator 34. The selected ions are then transferred to the space defined by the potential grids 27 in the second cell 11, by varying the potentials at the potential grids 24 and 27 correspondingly. The said space forms a second ion trap in which the ions can then be excited to resonate, by means of the electrodes 31. Other electrodes which are not shown in detail can then be used for receiving the resonance signals.

It is obvious that the spectrometer shown in the drawing permits any desired substances to be ionized by any method in the region 19 because the ionization region is located outside the magnet arrangement 1, 2 and, therefore, freely accessible for all types of measures. By displacing the limits of an ion trap formed by potential grids 22, 23, 24, 27, the ions so produced can then be transferred from the cell 8 to the cell 11 where the ion cyclotron resonances are determined precisely. During this process, the ions find themselves in that section of the magnet arrangement 1, 2 which exhibits the highest degree of homogeneity, and also in great number in a superhigh vacuum so that extreme sensitivity and, at the same time, extreme resolution can be achieved. The shield grid 29 makes it possible, by application of a suitable potential, to shield the ion trap in the second cell 11, which is delimited by the potential grids 27, from any influences that may still emanate from the first cell 8 serving to effect the ionization. The spectrometer shown, therefore, in the first cell 8 provides the possibility to ionize a new sample, to store the ions so produced and, if necessary, even to select the ions in the zone 24, 30 within the magnet coil 1 while the measuring process is being carried out in the second cell 11. Consequently, the spectrometer shown offers the possibility to reduce the measuring time that would otherwise be required.

It is understood that the invention is not restricted to the embodiment described but that deviations are possible without leaving the scope of the invention. Instead of using an electron gun, it is, for example, also possible to employ other means for ionizing a sample substance so that substances of any desired type can be ionized. Further, the structure of the cells and of the potential grids and electrodes arranged therein may be different from the embodiment shown, which will be the case in particular when an iron magnet with its absolutely different configuration is used instead of a cyromagnet.

What is claimed is:

1. An ion cyclotron resonance spectrometer, comprising:

magnet means for generating a constant magnetic field which is homogeneous in space defined by the magnet means;

first and second cells arranged in the magnetic field, each of the cells being provided with electrodes forming an ion trap in each cell when corresponding potentials are applied, the cells being separated from each other by a common partition wall having an opening to permit ion transfer between the cells, the wall extending perpendicularly to the direction of the magnetic field;

pumping means connected to the first and second cells for creating different vacuum conditions in the cells;

ionization means for ionizing a sample and creating ions in the first cell evacuated to a lesser vacuum;

transmitter/receiver means connected to the second cell evacuated to a higher vacuum;

power source means for supplying the electrodes with potentials permitting the ions, selectively, to be retained in the respective ion traps or to be released for distribution between the first cell and the second cell; and a section of the first cell projecting out of the space defined by the magnet means and being located in the area of its stray field so that access to the first cell is not obstructed by the magnet means, wherein the ionization means is connected to this outer section of the first cell.

2. The spectrometer of claim 1, wherein the section of the first cell projecting out of the space defined by the magnet means is positioned in the field of an additional magnet.

3. The spectrometer of claim 1, wherein a number of potential grids are arranged in the first cell parallel to the partition wall and electrically connected to the power source means which contains means for controlling the potentials applied to the potential grids in such a manner that the ion trap is formed by sections of the first cell defined by the potential grids and is adapted for displacement along the first cell from a region located outside the magnet means towards the partition wall and, if necessary, even beyond the latter.

4. The spectrometer of claim 3, wherein electrode means for generating a.c. fields suitable for exciting ion cyclotron resonances are arranged in parallel to the magnetic field at least between two neighboring potential grids.

5. The spectrometer of claim 1, wherein in the second cell a number of potential grids are arranged in parallel to the partition wall and electrically connected to the power source means which limits the ion trap to a section of the second cell adjacent to the partition wall.

6. The spectrometer of claim 5, wherein a shield electrode is arranged between the partition wall and the potential grid deliminating the ion trap of the second cell and neighboring the partition wall.

7. An ion cyclotron resonance spectrometer, comprising:

magnet means for generating a constant magnetic field which is homogeneous within a space defined by the magnet means;

a first cell having an inner section positioned in the space and having an outer section projecting out of the space, the outer section being located in the stray field of the magnet means so that access to the outer section is not obstructed by the magnet means;

a second cell surrounding the inner section of the first cell, the first and second cells being separated from each other by a common partition wall having an opening to permit the transfer of ions from the first cell to the second cell;

electrode means in the first and second cells for forming an ion trap in each cell when corresponding potentials are applied;

pumping means for creating different vacuum conditions in the first and second cells;

ionization means connected to the outer section of the first cell for ionizing a sample and creating ions; and power source means for supplying the electrode means with potentials permitting the ions, selectively, to be retained in the respective ion traps or to be released from the first cell to the second cell.

* * * * *